United States Patent
Cuhat et al.

(10) Patent No.: US 6,700,314 B2
(45) Date of Patent: Mar. 2, 2004

(54) PIEZOELECTRIC TRANSDUCER

(75) Inventors: Daniel Cuhat, Broadview Heights, OH (US); Patricia Davies, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 10/402,465

(22) Filed: Mar. 28, 2003

(65) Prior Publication Data

US 2003/0146675 A1 Aug. 7, 2003

Related U.S. Application Data

(62) Division of application No. 09/876,650, filed on Jun. 7, 2001.

(51) Int. Cl.[7] .................. H01L 41/00; H01L 41/107; H01L 41/16
(52) U.S. Cl. ................ 310/800; 310/334; 310/319; 310/338; 310/339
(58) Field of Search ............................ 310/328, 800, 310/324, 319, 338, 339

(56) References Cited

U.S. PATENT DOCUMENTS

| 3,722,285 A | * | 3/1973 | Weber ...................... 73/382 R |
| 3,814,958 A | * | 6/1974 | Heitmann ................... 310/314 |
| 4,056,803 A | * | 11/1977 | White et al. ................ 367/191 |
| 4,085,349 A | * | 4/1978 | Farstad ...................... 310/319 |

(List continued on next page.)

FOREIGN PATENT DOCUMENTS

| JP | 02001119262 A | 4/2001 |
| JP | 02001156348 A | 6/2001 |
| JP | 02001326399 A | 11/2001 |

OTHER PUBLICATIONS

Ryou, J.K., K.Y. Park, and S.J. Kim, "Electrode Pattern Design of Piezoelectric Sensors and Actuators Using Genetic Algorithms," *AIAA Journal* 1998, 36, 227–233.

Callahan, J., and H. Baruh, "Modal Analysis Using Segmented Piezoelectric Sensors," *AIAA Journal* 1995, 12, 2371–2378.

Burke, S.E., and J.E. Hubbard, Jr. "Distributed Transducer Vibration Control of Thin Plates," *J. Acoust. Soc. Am.* 1991, 90, 937–944.

(List continued on next page.)

*Primary Examiner*—Thomas M. Dougherty
*Assistant Examiner*—J. Aguirrechea
(74) *Attorney, Agent, or Firm*—Maginot, Moore & Beck

(57) ABSTRACT

Various piezoelectric transducers are provided. In one form, a polymer film or thin ceramic piezoelectric transducer is formed of various piezoelectric (active) and dielectric (inactive) layers in which the piezoelectric effect may be attenuated locally at any given point on the surface of the transducer, by use of printed circuit patterns, preferably made by photolithography. This provides a practical realization of a distributed piezoelectric transducer with a bi-dimensional polarization profile that varies smoothly over the surface of the piezoelectric structure. Flexibility of the fabrication procedure provides a way to optimize the design of a distributed piezoelectric transducer for applications such as active vibration control. In another form, a segmented piezoelectric transducer includes a set of active elements such as piezofilms, electronics and flexible printed circuits and connected with external electronic circuitry. The segmented piezoelectric transducer uses a modulation scheme to combine the individual sensor outputs. Modal coordinates may be extracted from a test structure on which the segmented piezoelectric transducer is attached. As well, it is possible to use a distributed piezoelectric transducer to actuate a structure by using a time-varying polarization profile.

8 Claims, 14 Drawing Sheets

U.S. PATENT DOCUMENTS

| | | | |
|---|---|---|---|
| 4,107,660 A | * | 8/1978 | Chleboun .................... 340/566 |
| 4,137,475 A | * | 1/1979 | Yoshida et al. ......... 310/323.21 |
| 4,234,813 A | * | 11/1980 | Iguchi et al. ............... 310/366 |
| 4,314,174 A | * | 2/1982 | Wing et al. ................. 310/315 |
| 4,363,991 A | | 12/1982 | Edelman ..................... 310/316 |
| 4,868,447 A | | 9/1989 | Lee et al. .................... 310/328 |
| 4,987,456 A | * | 1/1991 | Snelling et al. .............. 399/319 |
| 5,054,323 A | | 10/1991 | Hubbard, Jr. et al. ....... 310/338 |
| 5,089,741 A | | 2/1992 | Park et al. ................... 310/800 |
| 5,170,666 A | * | 12/1992 | Larsen ......................... 73/571 |
| 5,329,341 A | * | 7/1994 | Nowak et al. .............. 399/319 |
| 5,329,498 A | * | 7/1994 | Greenstein .................. 310/334 |
| 5,398,885 A | | 3/1995 | Anderson et al. ............. 73/180 |
| 5,423,207 A | | 6/1995 | Flechsig et al. ............. 310/366 |
| 5,450,747 A | | 9/1995 | Flechsig et al. ............. 310/319 |
| 5,548,564 A | * | 8/1996 | Smith .......................... 310/334 |
| 5,578,761 A | | 11/1996 | Clark, Jr. et al. ............. 73/169 |
| 5,581,021 A | | 12/1996 | Flechsig et al. .............. 73/105 |
| 5,629,578 A | * | 5/1997 | Winzer et al. ............... 310/334 |
| 5,744,898 A | * | 4/1998 | Smith et al. ................. 310/334 |
| 5,877,612 A | * | 3/1999 | Straw .......................... 330/254 |
| 5,911,158 A | | 6/1999 | Henderson et al. ......... 310/328 |
| 6,046,632 A | * | 4/2000 | Straw ............................. 330/2 |
| 6,192,759 B1 | | 2/2001 | Schoess ....................... 310/328 |
| 6,220,084 B1 | * | 4/2001 | Chen et al. .................... 73/105 |
| 6,539,805 B2 | * | 4/2003 | Heaslip et al. ................ 73/649 |

OTHER PUBLICATIONS

Lee, C.K., and F.C. Moon. "Modal Sensors/Actuators", *ASME Journal of Applied Mechanics* 1990, 57, 434–441.

Meirovitch, L., and H. Baruh. "The implementation of Modal Fiters for Control of Structures." *J. Guidance* 1985, 8, 707–716.

Takagi, Kentaro, Kenji Nagasa, Kazuhiko Oshima, and Yoshikazu Hayakawa. "Modal Fitering for SImply SUpported Plate Using Equalty Segmented Piezoelectric Film." Proceedings of the American Control COnference 2001.

Collet, M. "Shape Optimization of Piezoelectric Sensors Dealing with Spill–Over Instability." IEEE Transactions on Control Systems Technology, vol. 9, No. 4, Jul. 2001.

* cited by examiner

PIEZOELECTRIC TRANSDUCER

This patent application is a divisional of and thus claims the benefit of U.S. patent application Ser. No. 09/876,650 filed Jun. 7, 2001 entitled Piezoelectric Transducer.

FIELD OF THE INVENTION

The present invention relates generally to piezoelectric sensors and actuators and, more particularly, to piezoelectric laminates, segmented piezoelectric film sensors, and the application thereof to modal analysis.

DESCRIPTION OF THE PRIOR ART

During the past decade, distributed piezoelectric sensors and actuators (collectively, transducers) have been used increasingly in the field of active vibration sensing and control. The basic idea is to bond a piezoelectric lamina onto a large surface of a thin vibrating structure. By collecting the piezoelectric charge induced by surface strains, one can estimate the vibrational state of the structure. Reversely or conversely, by applying an appropriate control voltage to the transducer, it is possible to excite (actuate) the structure and thus, for example, to generate an artificial damping effect or monitor structural behavior. Among the advantages of this approach are the light weight of the piezoelectric transducer and the possibility to embed the device in thin, flexible structures that are prone to vibrate. Use of this technology can be found from the aerospace industry to manufacturers of high-end consumer goods such as "smart skis" (i.e. skis that incorporate such transducer technology).

For this technology to be efficient, it is necessary for the polarization of the piezoelectric lamina to vary in a well-defined manner over the surface of the transducer. Since the piezoelectric sensitivity of a laminate is normally uniform, a weighting function must be applied to the transducer with the help of some controlled physical process.

It has been demonstrated that by measuring or inducing strains in a thin bending structure (such as a beam or plate) by means of a shaped piezoelectric lamina bonded on its surface, it is possible to sense or actuate directly a given modal contribution of a transverse motion, provided that the boundary conditions satisfy certain requirements that result in the orthogonality of these modes.

In this method, it can be shown that the local piezoelectric sensitivity of the transducer must follow an appropriate spatial sensing distribution (or weighting) function $\Lambda(\alpha_1, \alpha_2)$ in order to interact with a unique mode. It should be noted that the use of the two parameters $\alpha_1$ and $\alpha_2$ do not limit the domain of $\Lambda$ to a plane. Instead, $\alpha_1$ and $\alpha_2$ are bi-dimensional curvilinear coordinates that can define any point on the neutral surface of a three-dimensional shell. Since the piezoelectric sensitivity of a laminate is usually uniform, a weighting function must be implemented with the help of a controlled physical process. Sometimes, the operation of imposing a given polarization profile on a planar piezoelectric transducer is also called "shading". There are several available procedures for shading.

In one procedure, the longitudinal piezoelectric constants of the piezoelectric material can be adjusted to a value proportional to a weight function $\Lambda(\alpha_1, \alpha_2)$, by means of a manufacturing method such as repoling, doping or the dosage of a two-phase composite. It should be noted however that these techniques are costly and difficult to implement in practice.

In another procedure, a given area of a piezoelectric transducer is made effective by the presence of a pair of electrodes which can either collect the charges generated piezoelectrically (sensor mode) or impose an electric potential between them (actuator mode). Thus, an elementary type of spatial weighting is obtained by limiting the areas provided with electrodes. In this case, the weighting function takes only two values: $\Lambda=1$ inside the shape boundaries, or $\Lambda=0$. In practice, a photolithographic process can implement this profile.

For a beam, it is sufficient to implement a one-dimensional weight function. In this case, the appropriate variation of piezoelectric sensitivity can be obtained by varying the width of the electrode down the length of the beam since there is no deflection along this direction. To impose the correct sign of the weight (spatial sensing distribution) function, areas are defined where the polarization of the piezoelectric material should be accordingly positive or negative, either by bonding the laminate "face up" or "face down", or by inverting its contacting electrodes.

In the more general case of a structure whose deflection varies along two directions, a bi-dimensional spatial sensing distribution function can be approximated by a lattice of small electrodes that are turned either "on" or "off". However the task remains to connect electrically the individual active electrodes and to impose the correct function sign. In practice, this is only feasible if the "on" electrodes happen to be grouped in a few contiguous domains.

In spite of the elegance of their concept, modal sensors and actuators have an important limitation. A manufacturing process allowing control the weight function by repoling, doping, or dosing a two-phase composite is usually not available at the level of the application engineer. Furthermore, these steps would be very costly to implement. As a consequence modal sensors have not been applied to structural elements, such as plates and shells, unless their weight function could be reduced to a one-dimensional function or a product of such functions by separation of variables.

This difficulty and other factors have promoted the use of an approximated version of modal sensors, called segmented piezoelectric sensors. In this design the distributed effect of a piezoelectric laminate is replaced by an array of size-limited, discrete piezoelectric sensors, each of which are measured separately, and the outputs of which are being sampled, multiplied by discrete weight factors (calculated by the method of modal filtering), and then added. The main advantage of this method is that it shifts the operation of fixing the weight factors from the manufacturing process to an electronic operation, making it much more flexible. Thus, except for the number of channels, it is not more difficult to build such a system for a variety of shells and plates rather than a beam.

However, segmented piezoelectric sensors also have their shortcomings. For one, segmented piezoelectric sensors are only able to model a finite number of modes (the more transducers in the array, the higher this number). If unmodelled modal contributions (residual modes) are present, they constitute a source of noise. For another, segmented piezoelectric sensors are much less compact than modal sensors. Each channel requires a full measurement chain including coaxial cable, low current or charge sensitive amplifier and analog to digital converter. Furthermore, a digital signal processing board is required to carry out the computations to estimate the modal coordinates. By contrast, a modal sensor simply needs a unique coaxial cable and a low current or charge sensitive amplifier. For this reason it is more difficult to embed segmented piezoelectric sensors as elements of an intelligent structure. Finally, because of the analog to digital conversions involved with segmented piezoelectric sensors, it is difficult to include segmented transducers in sensing-actuating applications, such as the frequency-stabilizing element in a resonator. On the other hand, the use of a modal sensor in a resonating circuit is straightforward and may open the door to applications where the frequency of such a system could be used to monitor physical parameters, like the temperature of the structure or a variation of pressure exercised on it.

Because of the limitations imposed by these technologies, it is very difficult to obtain a polarization profile whose shape varies in function of two geometric dimensions. Thus, in order to apply this active control scheme to structures whose deflections vary along two independent coordinates, such as vibrating plates and shells, one of the following simplifying methods is normally used.

One such method is that the behavior of a bending plate may be approximated with the one of a bending beam, so that the electrode shaping method described above may be used.

Another such method is that an arbitrary, bi-dimensional polarization profile may be approximated with a discrete pattern. Namely, one may juxtapose a finite set of segmented piezoelectric sensors/actuators whose individual contributions are weighted and added up electronically.

A further such method is that a polarization profile can be roughly approximated by applying a "binary" weighting function, i.e. one in which contiguous areas are multiplied by values of either 0 or 1. This can be realized by bi-dimensional shaping of the measuring electrodes.

However, in each of these simplified embodiments, the efficiency of the control scheme is eventually affected. Possible problems may range from perturbations by residual modes to instabilities via spillover. The use of segmented sensors/actuators may also pose practical problems if many channels are required because of extra weight added to the test structure by the connect cables. As a consequence, there is a need for a new generation of distributed piezoelectric transducers in which arbitrary polarization profiles could be implemented in a versatile and practical manner.

There is also a need for a piezoelectric transducer that can efficiently implement a weighting function/distribution.

There is further a need for a new generation of segmented piezoelectric transducers.

SUMMARY OF THE INVENTION

In one form (referred to herein as Form A), the present invention is a piezoelectric transducer. Particularly, in one form the present invention is a multi-layered piezoelectrically active and inactive lamina structure having selective metalizations that implement a bi-dimensional weighting function of piezoelectric sensitivity.

When the lamina structure is attached to a thin structural element, the piezoelectric transducer may be used as a modal sensor and/or actuator.

The present invention provides at least the following advantages over known solutions to the problem of sensing or actuating transverse modes of vibration in thin structures, which may be applied to various applications too numerous to list: (1) compared to shaped piezoelectric modal sensors and actuators, it is straightforward to implement with this design any arbitrary two-dimensional weight function for structure such as plates and shells. Also, the problem of forcing the correct sign of the weight function is solved in the invention by collecting piezoelectrically induced charges on both faces/surfaces of active lamina of the piezoelectric laminate in a first configuration, and on two individual laminas of the piezoelectric laminate in a second configuration; (2) modal sensors whose weight functions have been built-in by modulating the piezoelectric sensitivity of the material by a manufacturing means, such as repoling, are very costly and often the technology is not readily available, if at all, to engineers, while the technologies required by the present invention in order to implement the weight function (e.g. photolithography or screen printing) are widely available and economical; (3) segmented piezoelectric sensors require a full measurement chain (i.e. a transmitting cable, an impedance converter such as a charge amplifier, and a sampling circuit converting the analog signal into digital form) for each channel. This prior approach becomes very expensive, and thus not practical for modal filtering because of the high number of channels. As well, perturbations by residual modes are then more likely to occur. By contrast, a very high density of weighted "channels" can be implemented with the present invention at no special cost, the limitation being set by the resolution of the available photolithographic or screen-printing process. Also, prior segmented piezoelectric sensors and actuators require an analog to digital conversion (digital to analog, respectively) and dedicated digital signal processing boards. For the present invention, all that is needed is a low-current or charge sensitive amplifier in the sensing mode and a sine voltage generator in the actuating mode for the present piezoelectric laminate.

In another form (herein referred to as Form B), the present invention is a segmented piezoelectric film sensor. The segmented piezoelectric film sensor includes a set of active elements mounted onto a base and connected with external circuitry. The set of active elements includes piezofilms/sensors, individual electronics for each segment, and a flexible printed circuit. The external circuitry provides a modulation scheme to combine individual sensor outputs and to extract modal coordinates from a test structure on which the segmented piezoelectric sensor is mounted.

The invention has advantages over prior segmented piezoelectric sensors and to modal filtering using segmented piezoelectric sensors. In particular, compared to prior segmented piezoelectric sensors, the present invention simplifies the required hardware by replacing N-2 measurement chains—each comprising a low current or charge sensitive amplifier and a coaxial cable—with 2N digital modulation signals and electric wires, and by eliminating the need for a digital signal processing board, the system output being a signal directly proportional to the modal coordinate of interest. Also, the invention is always able to provide an estimate of the modal coordinate in real-time, even if a very large number of piezosensors have to be taken into account. Finally, the use of a flexible printed circuit in the present invention makes it easier to connect the active components mounted on the structure to the external electronic circuitry. As well, compared to shaped piezoelectric modal sensors, the system has the flexibility of being able to modify its weighting function, either to improve the estimate of the modal coordinate of interest, or to monitor a different modal coordinate.

BRIEF DESCRIPTION OF THE DRAWING

The above-mentioned and other features and advantages of this invention, and the manner of attaining them, will become more apparent and the invention will be better understood by reference to the following description of an embodiment of the invention taken in conjunction with the accompanying drawing comprised of a plurality of figures, wherein.

Corresponding reference characters indicate corresponding parts throughout the several views.

DETAILED DESCRIPTION

While the invention is susceptible to various modifications and alternative forms, the specific embodiment(s) shown and/or described herein is by way of example. It should thus be appreciated that there is no intent to limit the invention to the particular form disclosed, as the intention is to cover all modifications, equivalents, and alternatives falling within the spirit and scope of the invention as defined by the appended claims.

Figure 1:
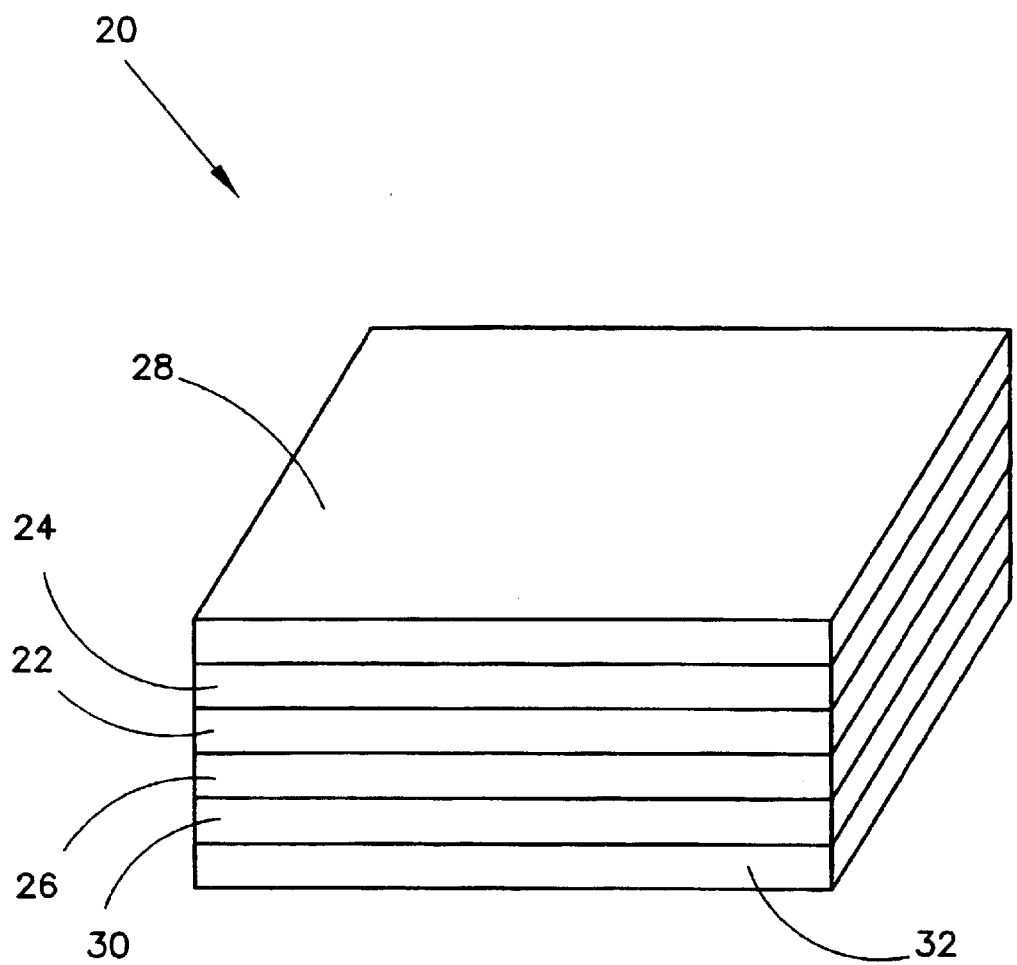
FIG. 1 is a perspective view of a piezoelectric lamina structure in accordance with the principles of Form A of the present invention.

Referring now to FIG. 1, there is shown an embodiment of a piezoelectric device, generally designated 20, in accordance with the principles presented herein. The piezoelectric device 20 is functional as a sensor and/or an actuator and will hereinafter be referred to as a piezoelectric transducer 20. In general, the piezoelectric transducer 20 is a laminate composed of a plurality of layers or lamina as hereinafter described.

Figure 2:
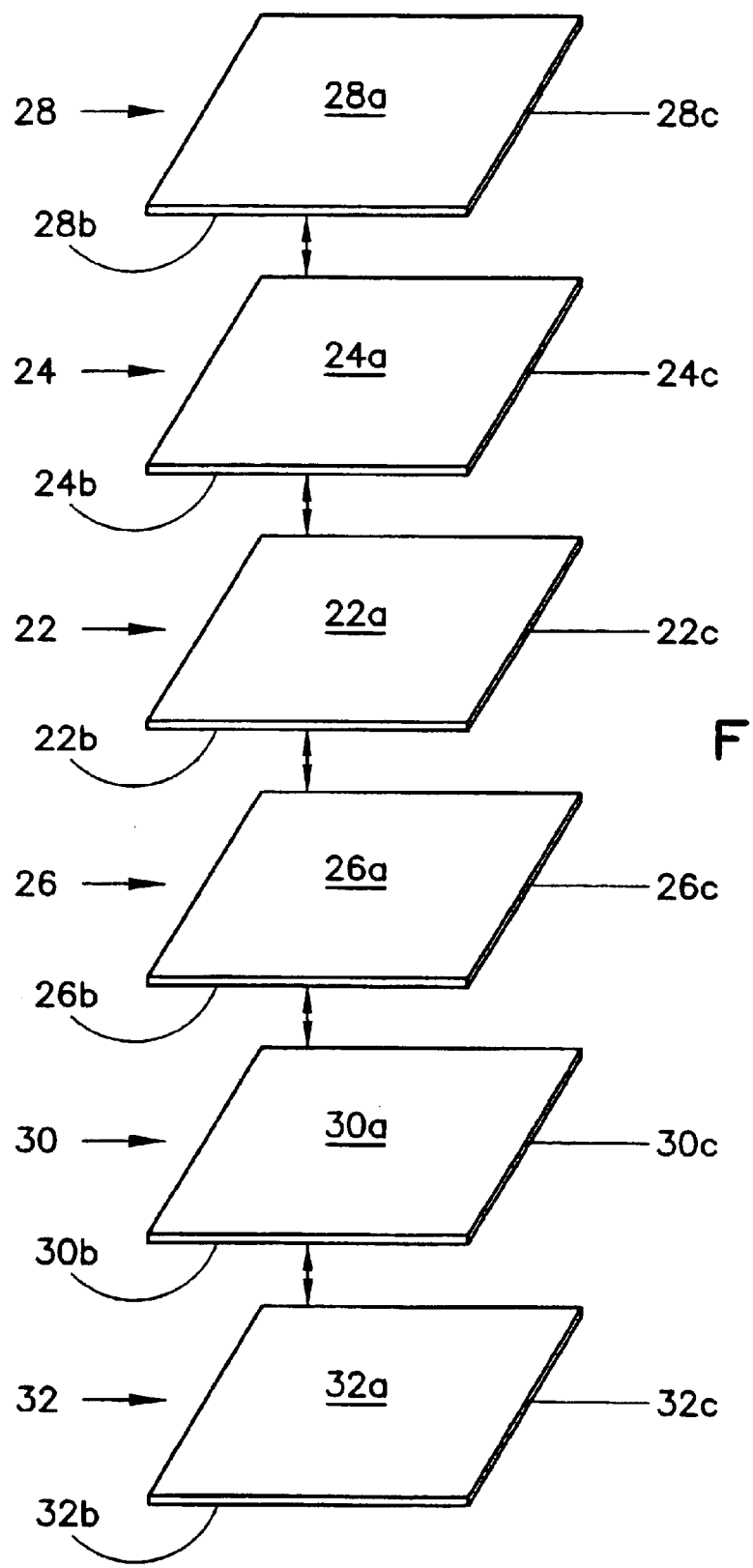
FIG. 2 is a an exploded view of the individual laminas of the piezoelectric lamina structure of FIG. 1.

The piezoelectric transducer 20 includes a middle lamina 22, a first upper lamina 24, a first lower lamina 26, a second upper or top lamina 28, and a second lower or bottom lamina 30, all of which is provided on a base or structural component 32. Referring additionally to FIG. 2, the middle lamina 22 is defined by a plate or sheet 22c of a piezoelectric active material. The plate 22c has an upper surface or face 22a and a lower surface or face 22b. In accordance with the principles of the present invention, the upper and lower surfaces, 22a and 22b, are metalized (i.e. layered with an electrically conductive material such as a metal). As described more fully below, the upper and lower metalized surfaces 22a and 22b are patterned or etched selectively, preferably by using a photolithographic or screen printing process.

The first upper lamina 24 is defined by a thin layer 24c of a piezoelectrically inactive material of preferably a constant thickness. The layer 24c has an upper surface or face 24a and a lower surface or face 24b. Preferably, the lamina 24 is an adhesive such that the lower surface 24b is bonded onto the upper surface 22a of the lamina 22.

The first lower lamina 26 is defined by a thin layer 26c of a piezoelectrically inactive material of preferably constant thickness in like manner to the lamina 24. The layer 26c has an upper surface 26a and a lower surface 26b. Preferably, the lamina 26 is an adhesive such that the upper surface 26a is bonded onto the lower surface 24b of the lamina 24. Preferably, the lamina 26 and the lamina 24 have substantially identical dielectric constants.

The second upper or top lamina 28 is defined by a plate or sheet 28c of a piezoelectrically inactive material. The plate 28c has an upper surface or face 28a and a lower surface or face 28b. The upper and lower surfaces 28a and 28b of the plate 28c are metalized but not etched or patterned. The lower surface 28a of the plate 28c is bonded to the upper surface 24a of the plate 24c.

The second lower or bottom layer 30 is defined by a plate or sheet 30c of a piezoelectrically inactive material. The plate 30c has an upper surface or face 30a and a lower surface or face 30b. The upper and lower surfaces 30a and 30b of the plate 30c are metalized but not etched or patterned. The upper surface 30b of plate 30c is bonded to the lower surface 26b of the plate 26c.

The laminate 20 composed of laminas 22, 24, 26, 28, and 30 is bonded onto the base 32. The base 32 is defined by a shell, beam, or other structural component. The plate 32c has an upper surface or face 32a and a lower surface or face 32b. The lower surface 30b of the lamina 30 is bonded to the upper surface 32a of the base 32.

Figure 3A:
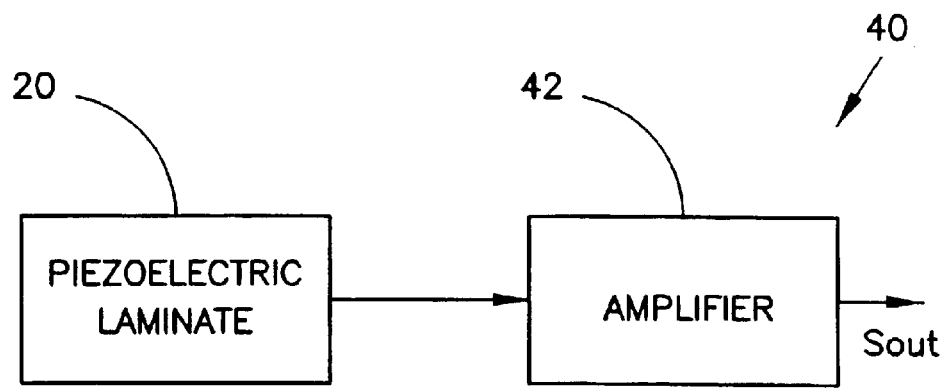
FIG. 3A is a block diagram of an exemplary system utilizing the piezoelectric lamina structure in a sensor mode for Form A of the invention.

In FIG. 3A there is depicted a block representation of a piezoelectric sensor system generally designated 40. The piezoelectric system 40 includes the piezoelectric transducer 20 in communication with an amplifier 42 such that the system 40 provides a sensing mode for the piezoelectric transducer 20. The piezoelectric transducer 20 provides signals that are amplified by the amplifier 42. The amplifier 42 provides an output signal $S_{OUT}$ that represents piezoelectric signals from the piezoelectric transducer 20.

Figure 3B:
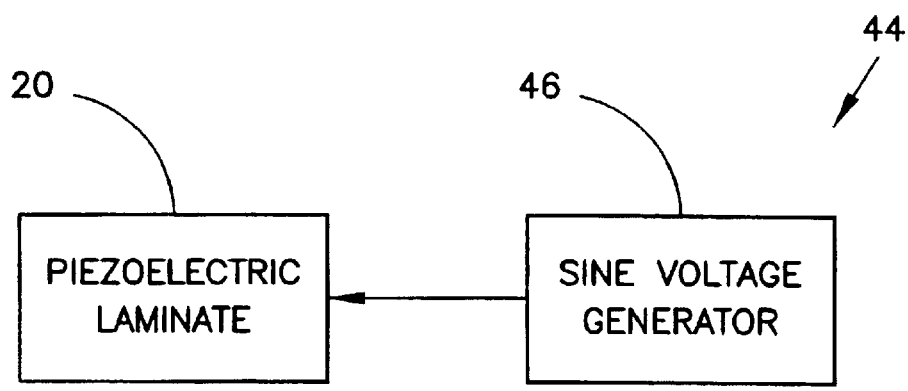
FIG. 3B is a block diagram of an exemplary system utilizing the piezoelectric lamina structure in an actuator mode for Form A of the invention.

In FIG. 3B there is depicted a block representation of a piezoelectric actuator system generally designated 44. The piezoelectric system 44 includes the piezoelectric transducer 20 in communication with a voltage generator 46, preferably generating a sine wave of a given voltage, such that the system 44 provides an actuating mode for the piezoelectric transducer 20. The sine voltage generator 46 provides its signal to the piezoelectric transducer 20.

Figure 4:
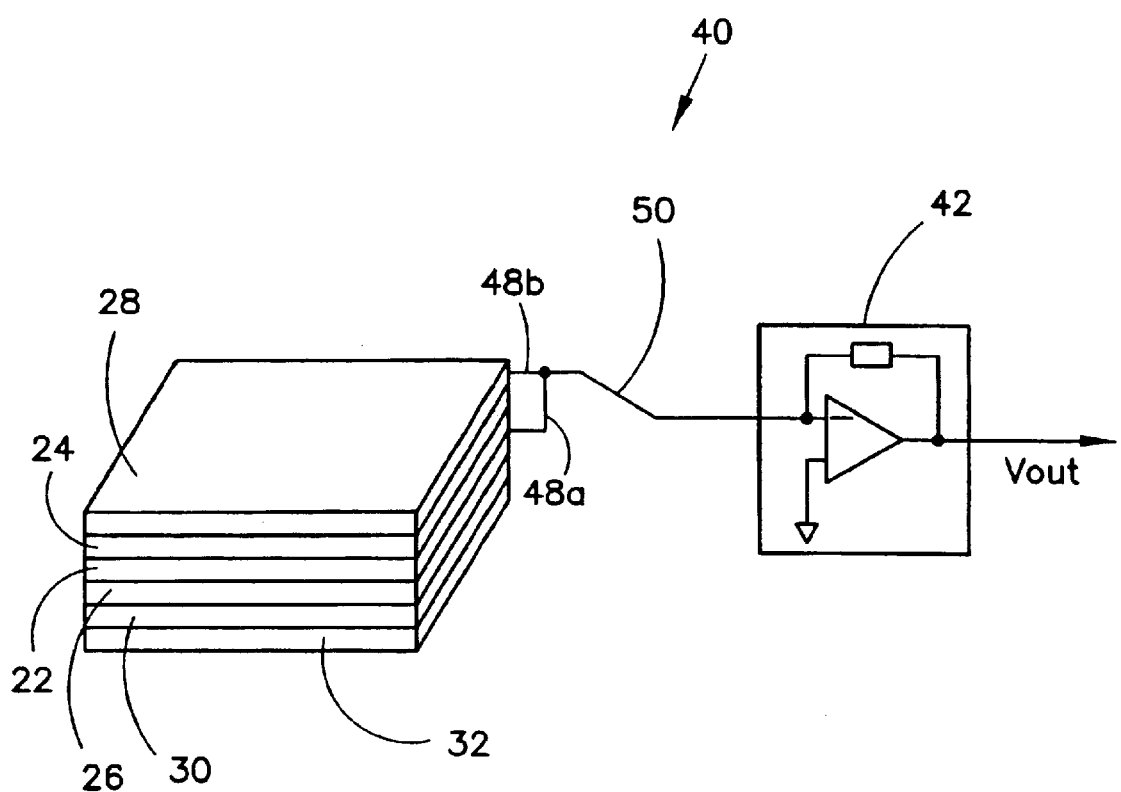
FIG. 4 is a more detailed diagram of an exemplary system utilizing the piezoelectric lamina structure of FIG. 3A.

Referring now to FIG. 4, there is shown an exemplary embodiment of a more detailed piezoelectric transducer system 40 as set forth in FIG. 3A. The piezoelectric transducer 20 is electrically coupled to the amplifier 42 via a coaxial cable 50. More particularly, the metalized lower surface 28b of the lamina 28 is coupled via an electrical line 48b to the coaxial cable 50 while the upper surface 30a of the lamina 30 is coupled via an electrical line 48a to the coaxial cable 50. The amplifier 42 is preferably a charge sensitive (or low-current) amplifier that provides a voltage output signal $V_{OUT}$.

Figure 5A:
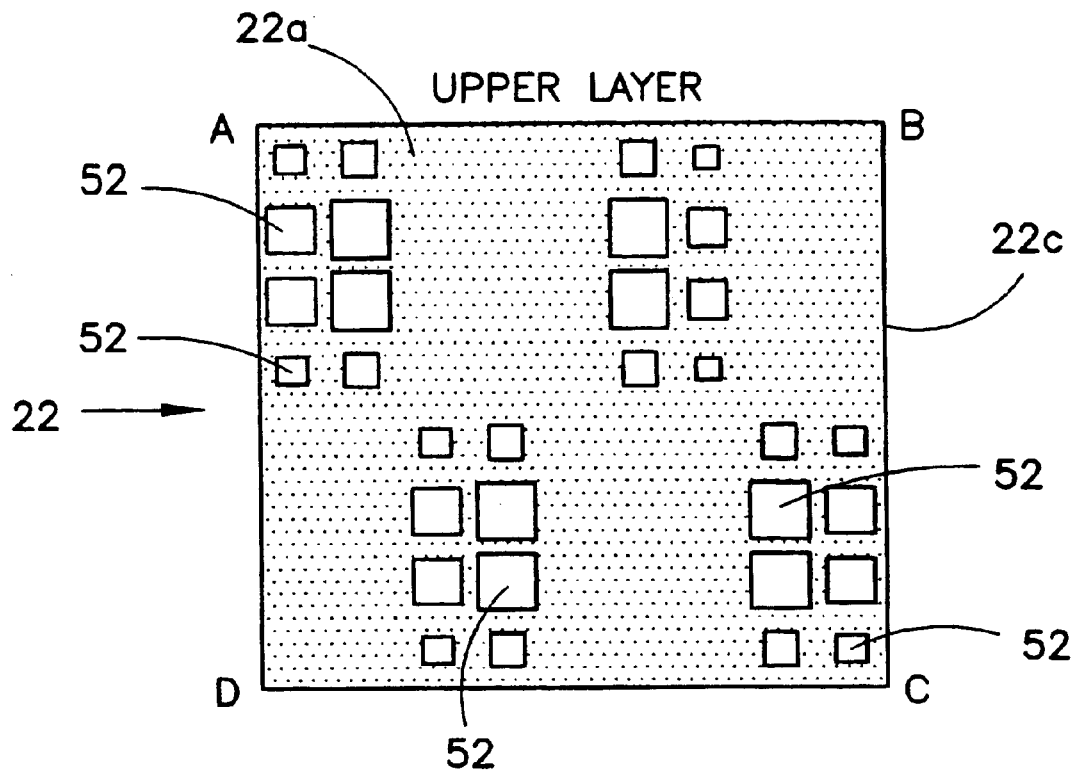
FIG. 5A relates to Form A of the invention and is a top plan view of an upper surface or face of a lamina of one embodiment of the piezoelectric lamina structure of FIG. 1 having an exemplary electrode pattern thereon.
Figure 5B:
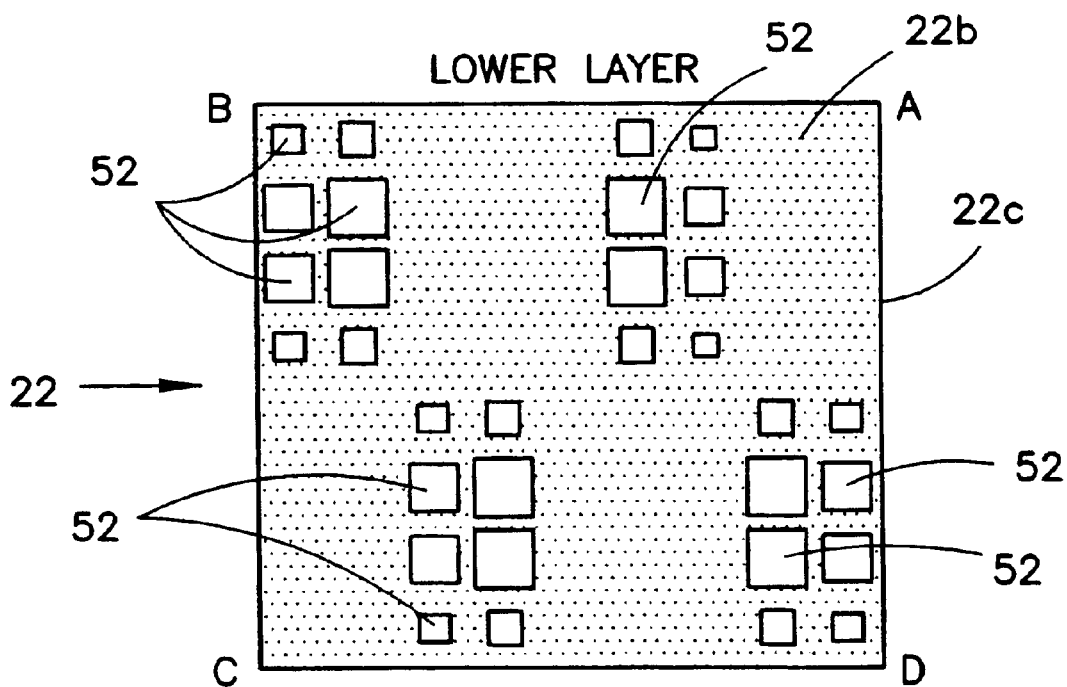
FIG. 5B relates to Form A of the invention and is a top plan view of a lower surface or face of the lamina of FIG. 5A having an exemplary electrode pattern thereon (Form A)

Referring to FIGS. 5A and 5B, and in accordance with an aspect of form A of the present invention, the upper and lower metalized surfaces 22a (FIG. 5A) and 22b (FIG. 5B) of the middle lamina 22 are formed such that a pattern of openings 52 are formed in each surface. The upper and lower metalized surfaces 22a and 22b thus form electrodes. The pattern of openings 52 in each metalized surface 22a and 22b are preferably formed via a photolithography or screen-printing process (patterning). The surface density of the metalized surface, after undergoing patterning, defines the magnitude of a weight function in a given area. By grounding the electrodes (i.e. the upper and lower metalized surfaces 22a and 22b) a transverse polarization field generated inside the piezoelectric lamina 22 has no external effect wherever the surface is covered by metalization. Thus, the metalization/electrodes locally act as shields to the polarization field. An opening 52, however, allows the transverse polarization field to extend out of the piezoelectric lamina 22, through the dielectric layers (laminas 24 and 26) by capacitive coupling and finally reaches the inside metalization of the laminas 28 and 30.

The following conditions are imposed on the geometry of the etched patterns: if there is an opening 52 on either face/surface (22a, 22b) of the piezoelectric lamina 22, the opposite area facing it must be shielded (see FIGS. 5A and 5B, and note the alignment of the corners ABCD). Since the electrodes (metalization) of the lower surface 28b of the lamina 28 and the upper surface 30a of the lamina 30 are continuous, they collect the contributions of the transverse polarization field passing through the openings 52 of the upper shield/metalization/electrode 22a and the lower shield/metalization/electrode 22b, respectively, where they are converted into a total electric charge. It should be noted that a distinction must be made between the electrodes (metalizations) of the lower surface 28b of the lamina 28 and the upper surface 30a of the lamina 30: the sign of a given transverse polarization field appears to be reversed if seen from the measuring electrode (28b) of the lamina 28 to the grounded shield or if it is measured from the electrode (30a) of the lamina 30 to the grounded shield. Therefore, a given deformation of the piezoelectric lamina results in an accumulation of charges of different signs on each measuring electrode. The electric currents that are formed subsequently on these electrodes can be collected and measured by the low-current or charge sensitive amplifier 42.

If the relative size of each opening 52 is small compared to the variations of the transverse polarization field, i.e. if the field is practically constant over the surface of each opening 52, then it is possible to weigh the piezoelectric effect over a given area by fixing the size of the openings 52 covering a particular area of the lamina 22. In short, this effect is practically the same or similar to a sensing distribution function $\Lambda(\alpha_1, \alpha_2)$ weighting the local sensitivity of the piezoelectric lamina 22 (the sign of which is controlled by locating the shield openings 52 on the upper or lower faces 22a, 22b of the piezoelectric lamina 22). This weighting function is discrete since the density of the openings 52 in the shield (metalization) is limited by the resolution of the available technology (i.e. photolithography or screen printing process) as well as by capacitive border effects taking place in the dielectric laminas (laminas 24 and 26). However, the density of weighting operations per area is still much higher than what can be achieved with typical segmented piezoelectric sensors. For practical purposes, a modal filter implemented in this manner can reasonably be seen as a new type of modal sensor or actuator.

In this design, the openings 52 in the shields (i.e. the metalization on the surfaces 22a and 22b of the lamina 22) are not supposed to touch each other, since it would result in the isolation of metalized areas which could not be grounded any more. This restriction limits the range of the weight function from: $-1<\Lambda<1$, to approximately: $-0.5<\Lambda<0.5$. Also, the capacitive coupling operation reduces the strength of the polarization field by a factor: $\gamma=1/(1+\kappa)$, where $\kappa=(\epsilon_r^1 \delta_2)/(\epsilon_r^2 \delta_1)$, $\epsilon_r^1$, $\epsilon_r^2$ are the relative dielect constant of the laminas 22, 24, and 26, and $\delta_1$, $\delta_2$ are the thickness of the laminas 22, 24, and 26, respectively. Therefore, the local signal that could be measured with the piezoelectric lamina is multiplied here by a weighting function having values in the following range: $-0.5\gamma<\Lambda<0.5\gamma$.

The outside metalization (surface 28a and surface 30b) of the laminas 28 and 30, respectively, should be grounded to provide a global electric shield for the piezoelectric laminate 20. Likewise, the electric connections 48a and 48b (see FIG. 4) between the measuring electrodes (surface 28b and surface 30a) of the laminas 28 and 30 respectively, are preferably realized with short coaxial cables, in order to protect their signal against electromagnetic interferences.

In one form, it is possible to utilize polymer films for the various laminas. The middle lamina 22 can be made out of a bi-metalized piezoelectric polyvinylidene fluoride (PVDF) film. Thin commercial transfer tape may be used as dielectric laminas/adhesives 24 and 26, while a thin bi-metalized polyester film may be utilized for the outside laminas 28 and 30.

In accordance with another aspect or form of the present invention and referring to FIGS. 1 and 2, the piezoelectric transducer 20 again has five (5) layers or lamina that may be used with the systems of FIGS. 3A, 3B, and 4. However, in this embodiment, the central or middle lamina 22 is made from a thin, piezoelectrically inactive adhesive. The first upper lamina 24 is from a plate of piezoelectrically active material that is bonded to the middle lamina 22. The first lower lamina 26 is made from a preferably identical plate of piezoelectrically active material that is bonded to the middle lamina 22. In essence, the lamina 24 and the lamina 26 are effectively bonded together via the middle lamina 22 of adhesive.

Figure 6A:
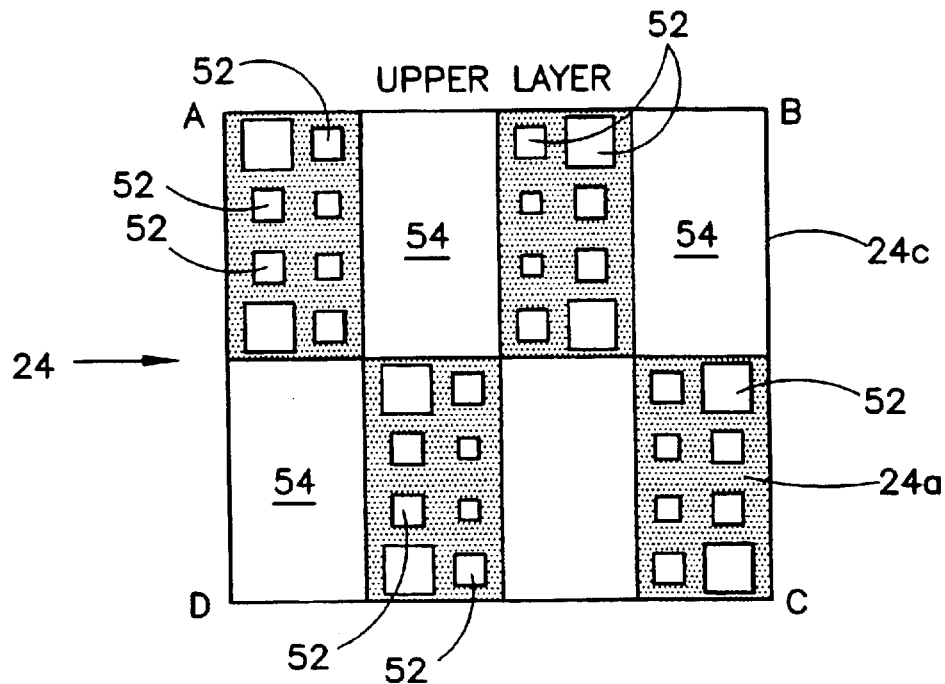
FIG. 6A relates to Form A of the invention and is a top plan view of an upper surface or face of a lamina of another embodiment of the piezoelectric lamina structure of FIG. 1 having an exemplary electrode pattern thereon.
Figure 6B:
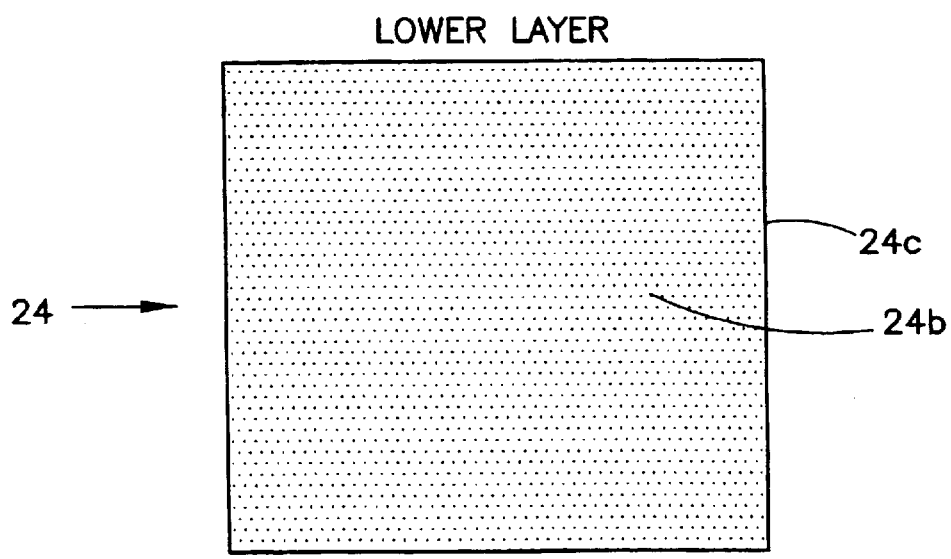
FIG. 6B relates to Form A of the invention and is a top plan view of a lower surface or face of the lamina of FIG. 6A having an electrode thereon.

With reference to FIGS. 6A and 6B, the upper and lower surfaces, 24a and 24b, of the lamina 24 are covered, such as by metalization, by electrodes. The upper surface 24a has a pattern of openings 52 and 54 that are preferably formed via photolithography or screen-printing. The metalization of the lower surface 24b of the lamina 24 is coupled to a suitable ground. The upper surface 24a is coupled via lead 48b to the coaxial cable 50 (reference FIG. 4) such that any signal collected via the electrode or metalization is coupled to the amplifier 42.

Figure 7A:
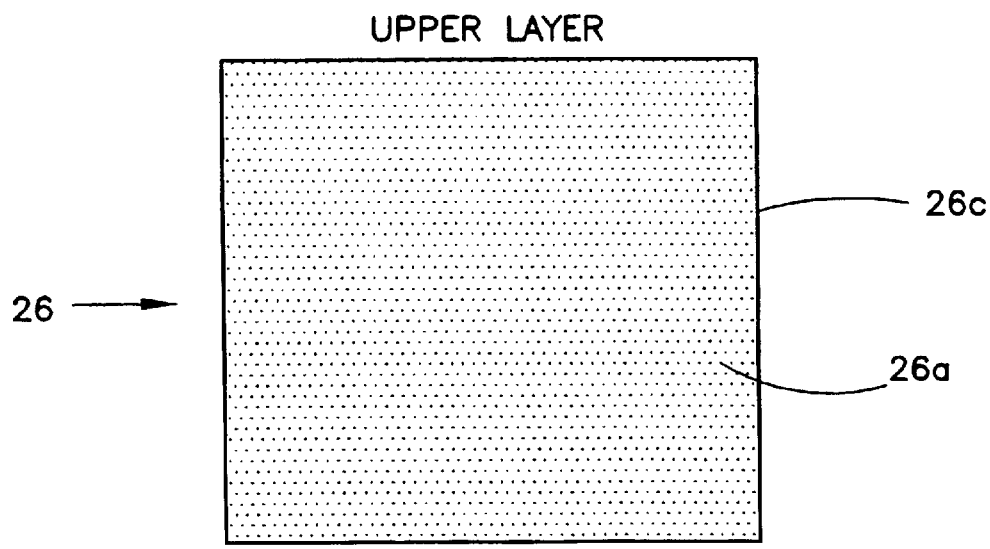
FIG. 7A relates to Form A of the invention and is a top plan view of an upper surface or face of another lamina of the second embodiment of the piezoelectric lamina structure of FIG. 1 having an electrode thereon.
Figure 7B:
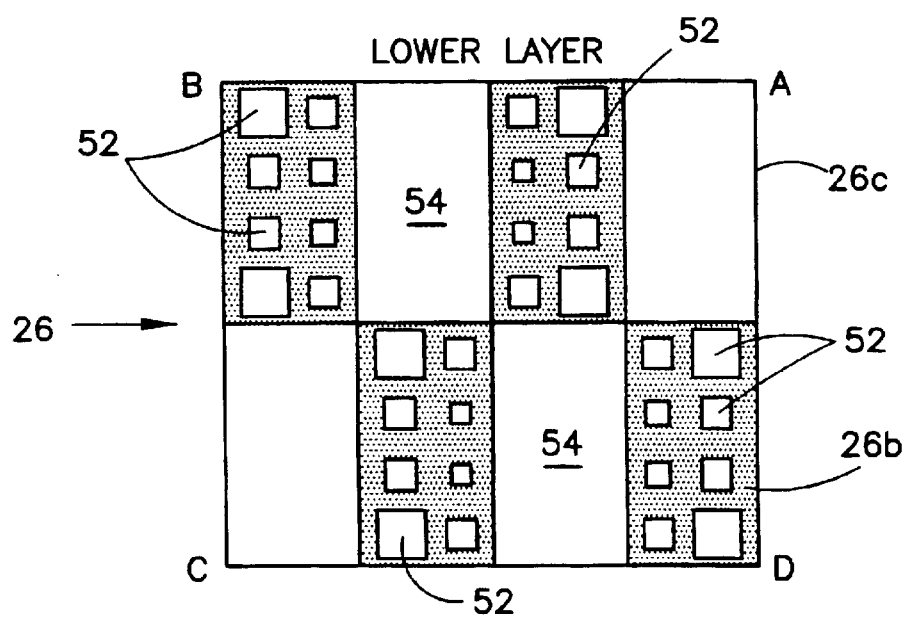
FIG. 7B relates to Form A of the invention and is a top plan view of a lower surface or face of the lamina of FIG. 7A having an exemplary electrode pattern thereon.

Referring to FIGS. 7A and 7B, the upper and lower surfaces 26a and 26b of the lamina 26 are covered, such as by metalization, by electrodes. The upper surface 26a is coupled to a suitable ground. The lower surface 26b has a pattern of openings 52 and 54 that are preferably formed via photolithography or screen-printing. The lower surface 26b is coupled via lead 48a to the coaxial cable 50 (reference FIG. 4) such that any signal collected via the electrode or metalization is coupled to the amplifier 42.

The lamina 28 is made of a piezoelectrically inactive (dielectric) material that is bonded onto the lamina 24. The outer surface 28a of the lamina 28 is provided with an electrode or metalization that is coupled to a suitable ground. The lamina 30 is also made of a piezoelectrically inactive (dielectric) material that is bonded onto the lamina 26. The outer surface 30b of the lamina 30 is provided with an electrode or metalization that is coupled to a suitable ground. The electrodes of the upper surface 28a and the lower surface 30b act as shields for the high impedance sensor (piezoelectric laminate 20) against external electromagnetic interference.

With respect to this embodiment, the frequency of the openings 52 and/or 54 are varied to control the amount of charge per area collected by the measuring electrodes 24a and 26b, and therefore to simulate the effect of a spatial weighting distribution function modulating the overall piezoelectric sensitivity of the piezoelectric laminate 20. However, unlike prior configurations, the openings 52 and/or 54 or "holes" in the electrodes 24a and 26b are used to inactivate the areas they cover, since the outer electrodes of the laminas 24 and 26 cannot collect a free piezoelectric charge at these locations. The upper layer 24a of the lamina 24 is only active over areas where the weight function is positive, whereas the lower layer 26b of the lamina 26 is only active over areas where this function is negative.

Now, provided that the two piezoelectric laminas 24 and 26 share the same poling orientation, the polarization imposed by the respective position of ground and measuring electrodes ensures that the signals generated on each layer have the proper sign. The overall weighted response is finally obtained by adding the respective charges at the node or junction of the electrical leads 48a and 48b, and the coaxial cable 50. It should be appreciated that in this configuration, the piezoelectric signals need not be coupled capacitively to transmit the signal to the amplifier 42, so that the piezoelectric sensor 20 will have a higher signal to noise ratio than the other embodiment.

Again, commercially available piezoelectric PVDF film and thin transfer tapes may be used to build the present piezoelectric laminate 20. The piezoelectric laminate 20 along with the amplifier 42 provides a piezoelectric sensor. Conversely, the piezoelectric laminate 20 along with an actuator or sine voltage generator 46 (reference FIG. 3B) provides a piezoelectric actuator.

Figure 8:
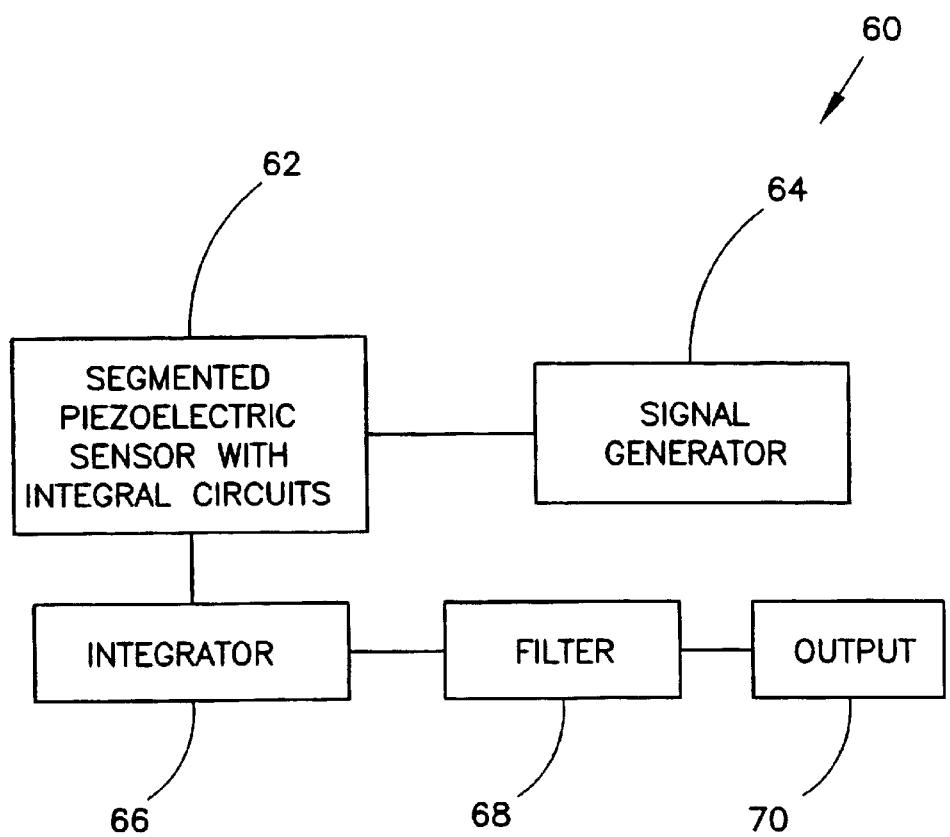
FIG. 8 is a block diagram of a system utilizing a segmented piezoelectric sensor (Form B) in accordance with the principles of an aspect of the present invention.

Referring to FIG. 8, there is depicted a block diagram of a piezoelectric sensor system for form B of the invention, generally designated 60, in accordance with an aspect of the present invention. The system 60 includes a segmented piezoelectric sensor having integral circuitry 62 in accordance with the present principles. A signal generator 64 is coupled to the segmented piezoelectric sensor 62 and provides configured signals or sets of modulated signals to the piezoelectric sensor 62. An integrator 66 is coupled to the piezoelectric sensor 62 that receives signals from the various segmented piezoelectric units of the segmented piezoelectric sensor 62. A filter 68 is provided for the output of the integrator 66, the filter 68 providing a piezoelectric output signals represented by block 70.

Figure 9:
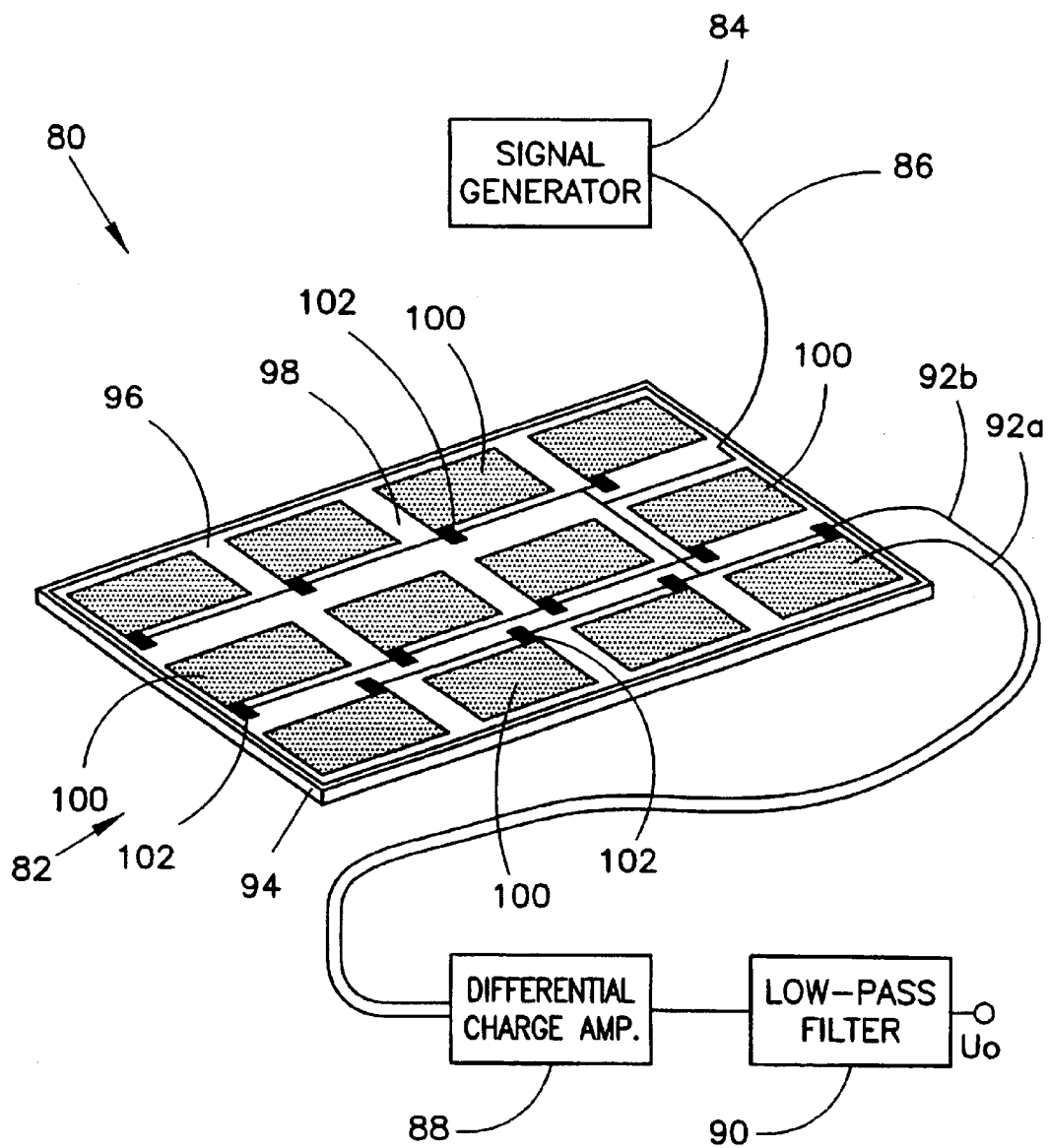
FIG. 9 is a perspective view of a segmented piezoelectric sensor (Form B) in an exemplary system of the manner of FIG. 8.

In particular, and referring to FIG. 9, there is depicted an exemplary system, generally designated 80, implementing the system 40 of FIG. 8. The system 80 includes a segmented piezoelectric sensor made in accordance with the principles presented below, generally designated 82. The segmented piezoelectric sensor 82 includes a polymeric thin film, substrate, or the like 96 that is bondable to a test structure 94. The polymeric film 96 may be a polyester film, conductive epoxy, or the like. A plurality of piezoelectric sensors 100 are disposed on the polymeric film 96 and spaced from each other (i.e. segmented). A plurality of microelectronic circuits 102 are also mounted on the polymeric film 96, the number of which preferably corresponds with the number of the plurality of piezoelectric sensors 100. Preferably, a microelectronic circuit 102 is adjacent each one of the piezoelectric sensors 100. A patterned plurality of electrodes and conductive lines 98 are formed on the polymeric film 96 preferably by deposition, but which may take the form of any printed circuit or the like. The plurality of electrodes and conductive lines 98 connect each piezoelectric sensor 100 with an associated microelectronic circuit 102, communicate with an output, and communicate with an input.

The system 80 further includes a signal generator 84 that is coupled to the pattern of conductive lines 98 such that the signal generator 84 is in communication with each microelectronic circuit 102/piezoelectric sensor 100 pair via a conductor 86 at the input of the conductive lines 98. The conductor 86 is preferably a ribbon cable. Connected at the output of the conductive lines 98 are two conductors that are preferably coaxial cables 92a and 92b for collecting the currents generated on the surface electrodes of each piezoelectric sensor 100, such as that shown and described above, and processed by the respective microelectronic circuit 102. The conductors 92a and 92b are coupled to a differential charge amplifier 88 that integrates the collected piezoelectric currents. The differential charge amplifier 88 is, in turn, coupled to a low-pass filter 90 to demodulate the output signal $U_O$.

The signal generator 84 is operative to generate a set of distinct modulating signals for each microelectronic circuit 102 in the manner set forth below. The modulation scheme in conjunction with the segmented piezoelectric sensor 82 combines the piezoelectric signals. While the modulation signals are generated externally via the signal generator 84, the modulation signals may be generated by circuitry/logic integral with the segmented piezoelectric sensor 82. It is possible to provide dedicated signal generators via one or several application specific integrated circuits (ASICs) and to mount the components on the structure. These signals may be generated with bi-stable multivibrators, programmable logic devices, a microprocessor board, or the like.

The charge sensitive amplifier(s) 88 integrate the currents produced by the piezoelectric sensors 100 at the nodes defined by the cables 92a and 92b, and convert them into two low impedance voltage signals that are then subtracted from each other. The virtual grounds of these amplifiers also hold the voltage across the piezosensors constant, so that parasitic capacitors in the cable or in transistors (MOSFETs) do not affect the signal. The time integration performed by these components has the effect of canceling out the high frequency noise originating from the modulation signals and coupled through the parasitic capacitors of the MOSFETs (see below).

Figure 10A:
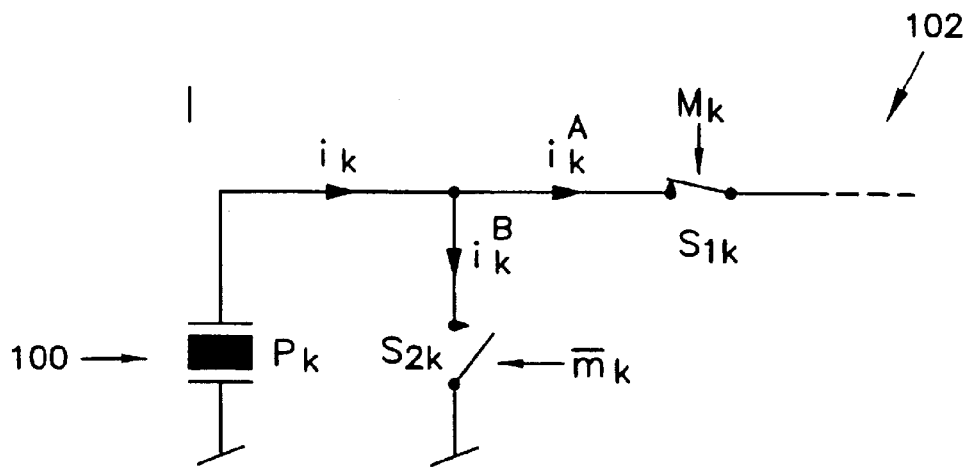
FIG. 10A is representation of switch positions in accordance with an aspect of Form B of the present invention.
Figure 10B:
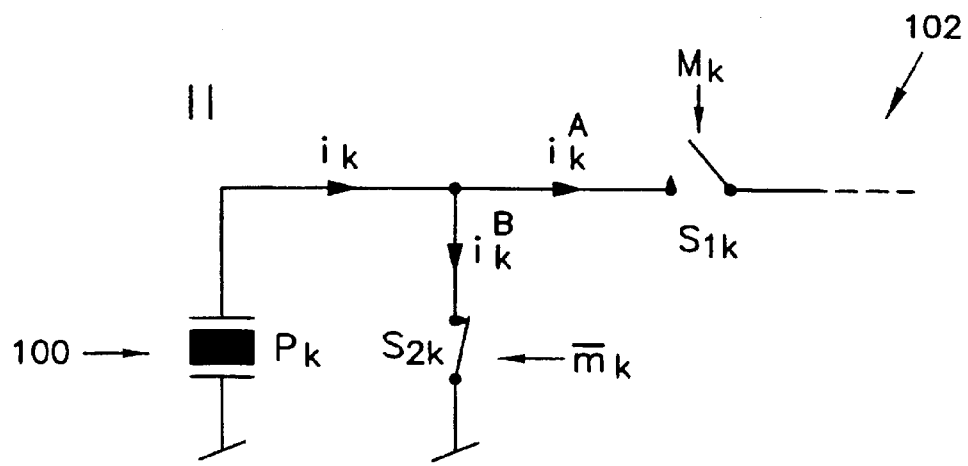
FIG. 10B is representation of switch positions in accordance with an aspect of Form B the present invention.
Figure 11A:
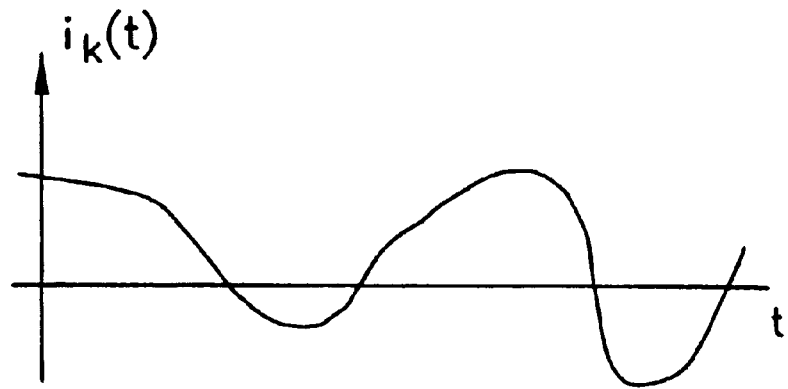
FIG. 11A is a graph of an exemplary piezoelectric signal from the system of FIG. 9.
Figure 11B:
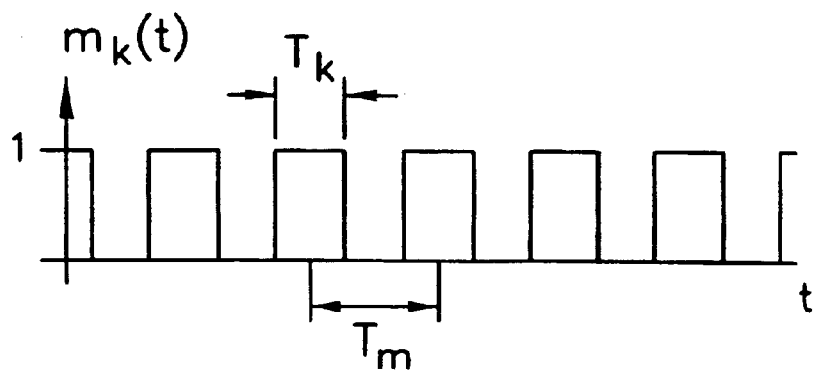
FIG. 11B is a graph of an exemplary pulse modulation signal for the system of FIG. 9.
Figure 11C:
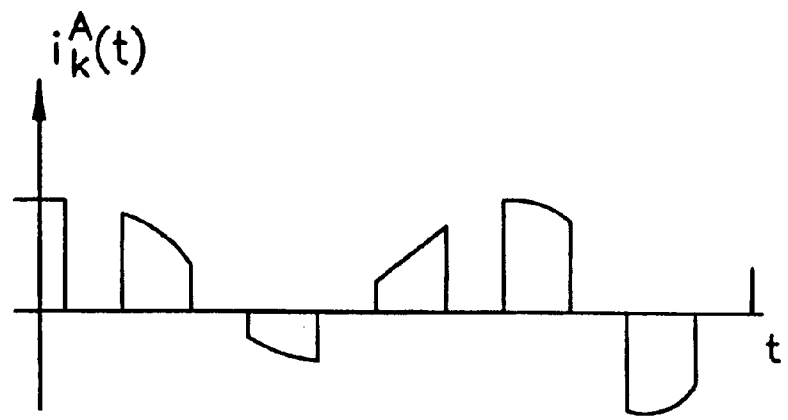
FIG. 11C is a graph of the combination of the signals of FIGS. 11A and 11B.

Each microelectronic circuit 102 includes, operates, and functions in the manner set forth below. Referring to FIGS. 10A and 10B, there is shown two states, positions, or modes of an exemplary embodiment of a microelectronic circuit 102 as coupled to a piezoelectric sensor 102. Specifically, pairs of analog switches $S_{1k}$ and $S_{2k}$ can be implemented so that the output of the kth sensing piezoelement is either directed to the remote charge amplifier 88 (position I, FIG. 10A) or grounded (position II, FIG. 10B). In these cases, the ON/OFF signals $m_{1k}(t)$ and $m_{2k}(t)$ actuating the switches $S_{1k}$ and $S_{2k}$ are in phase opposition so that $m_{1k}(t)=m_k(t)$ and $m_{2k}(t)$ and $-m_k(t)$. By alternating the positions I and II, the output current $i_k(t)$ (see FIG. 11A) can be modulated by the signal generator 84 into a measured current $i_k^A(t)$ (see FIG. 11C) with a pulse-width $T_k$ and a period $T_m$ (see FIG. 11B) or pulse-width modulation (pwm).

Each analog switch may be implemented with a solid-state device, such as a metal oxide semiconductor field effect transistor (MOSFET). Since these devices are very small, a pair can be surface-mounted or embedded in the vicinity of each piezofilm without interfering with the dynamics of the test structure 94 (see FIG. 9).

Figure 12A:
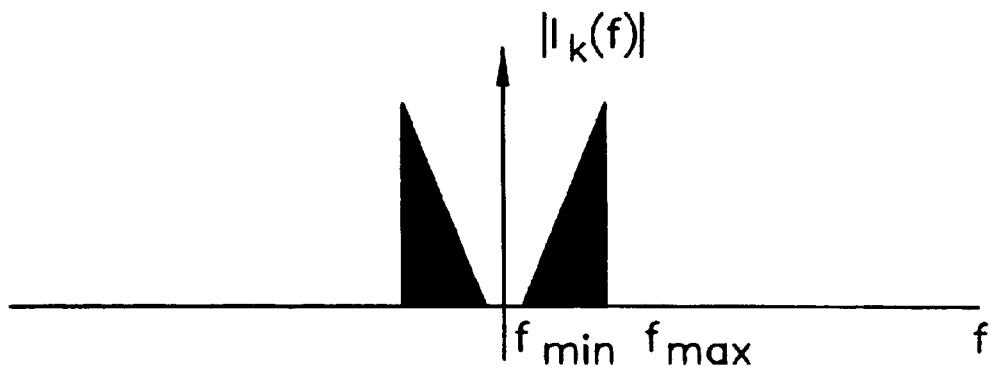
FIG. 12A is a frequency domain representation of a baseband signal of the system of FIG. 9.
Figure 12B:
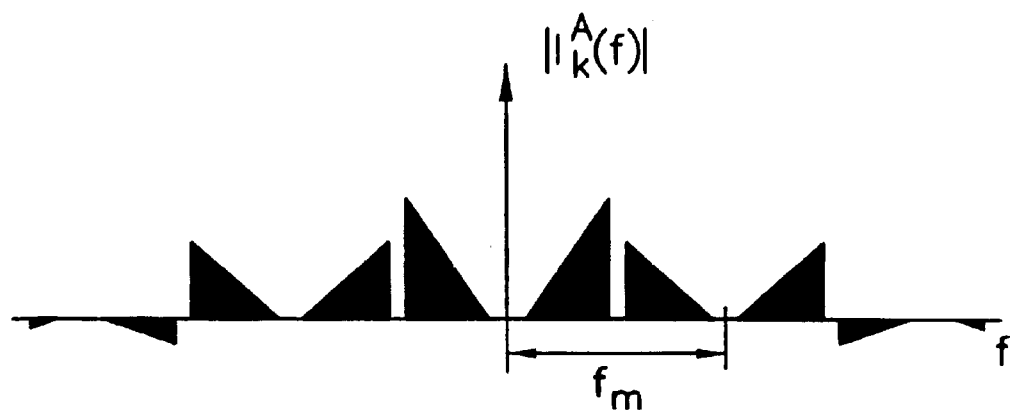
FIG. 12B is a frequency domain representation of a modulated signal of the system of FIG. 9.

Referring to FIG. 12A, there is shown a representation in the frequency domain of the output current $I_k(f)$. Referring to FIG. 12B, there is shown a representation in the frequency domain of the measured current $I_k^A(f)$. The baseband signal (FIG. 12A) can be recovered by utilizing the low-pass filter 90 to low-pass filter the measured current, provided that the sidebands do not overlap with the baseband. This is satisfied under the conditions that: i) the signal measured from the $k^{th}$ piezoelement in the sensor is bandlimited, i.e. there is a maximum frequency $f_{max}$ such that $I_k(f)=0$ if $f>f_{max}$, and ii) the modulating frequency $f_m=1/T_m$ is at least twice as high as the maximum frequency: $f_m \geq 2 f_{max}$. It should be understood that the amplitude of the demodulated current Demod $[i_k^A(t)]$ differs from the baseband signal by a scaling factor related to the pulse width and modulation frequency. Specifically:

$$\text{Demod}[i_k^A(t)] = (T_k/T_m) i_k^A(t).$$

Figure 13:
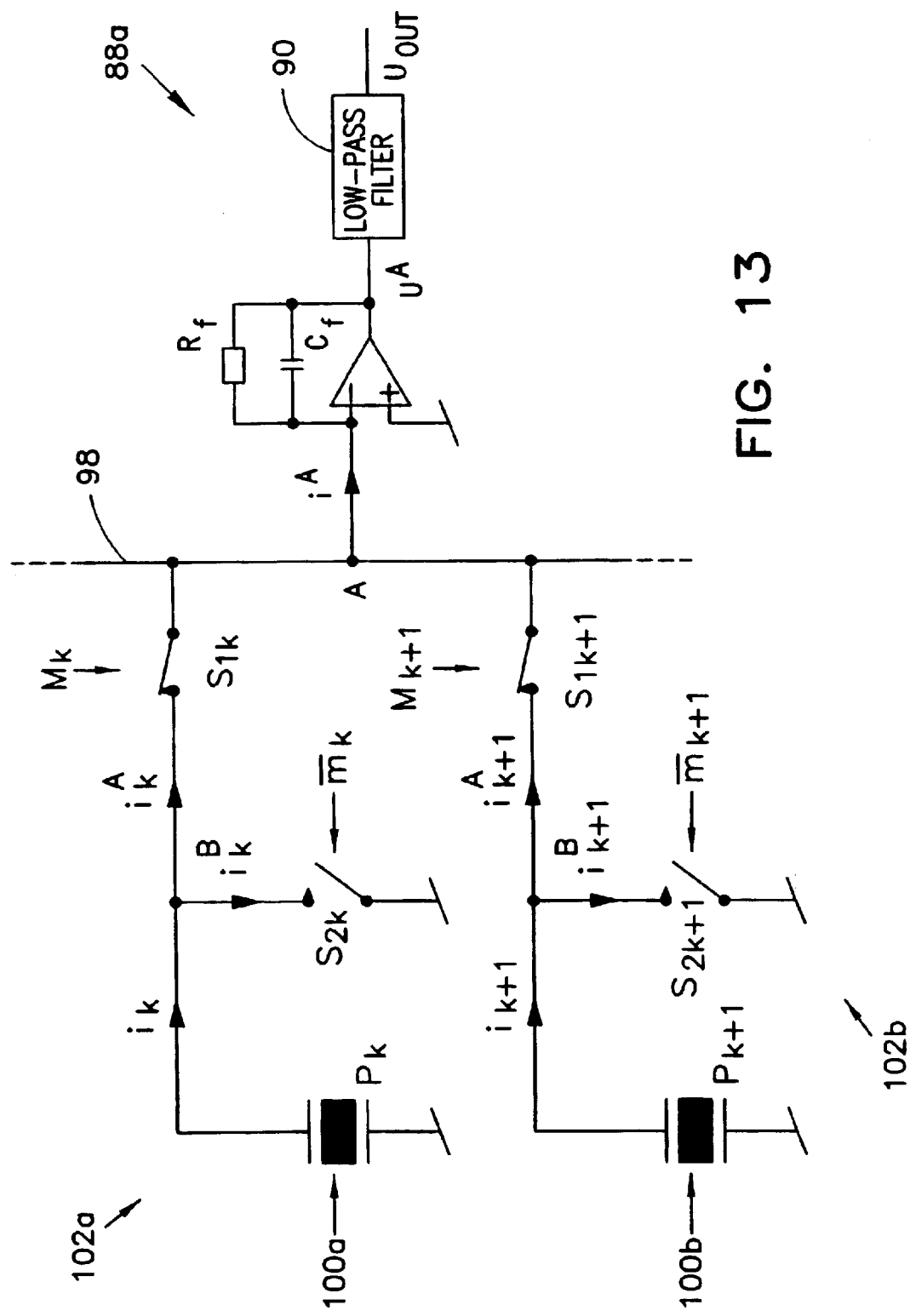
FIG. 13 is another switch representation for the system of FIG. 9 having a pulse-width modulation scheme.

Each piezoelectric sensor 100 output can be modulated in the same manner, but with different pulse-widths $T_k$, so that after demodulation each signal appeared as multiplied by a specific factor $L_k=(T_k/T_m)$. It is thus possible to add together the modulated currents at a common node A, demodulate their sum $i^A(t)$ with a low-pass filter and then time integrate the resulting current and convert it into a voltage with a charge amplifier 88a as shown. In practice, however, it is more convenient to first pass the modulated current $i^A(t)$ through a charge amplifier and then proceed with the demodulation, as shown in the FIG. 13 (by linearity, the order of these operations makes no difference).

In this system, the output yields the voltage:

$$U_{out}(t) = (1/C_f) \sum_{k=1}^{N} L_k q_k(t),$$

where $C_f$ is the feedback capacitor of the charge amplifier and $q_k$ is the charge generated by each piezosensor 100.

If the factors $L_k$ in the above equation are identical with the $i^{th}$ line of a gain matrix of a modal filter, then the output voltage would be proportional to the $i^{th}$ modal coordinate of the system. However, in this scheme the factors $L_k$ display all the same sign, since the ratio $T_k/T_m$ is always positive. For modes of higher order than one, though, there will always be a number of negative entries. In order to remedy this problem, a differential configuration 88b as shown in FIG. 14 may be used.

In this circuit the currents are not grounded during the phase II (see FIGS. 10A and 10B), but instead are being summed at a second node B and are then directed to a second charge amplifier. By subtracting $u^B$ from $u^A$ with a differential amplifier, the output voltage yielded by the system is the same as given in the above equation, where now:

$$L_k=(R_2/R_1 C_f)[2(T_k/T_m)-1].$$

Figure 14:
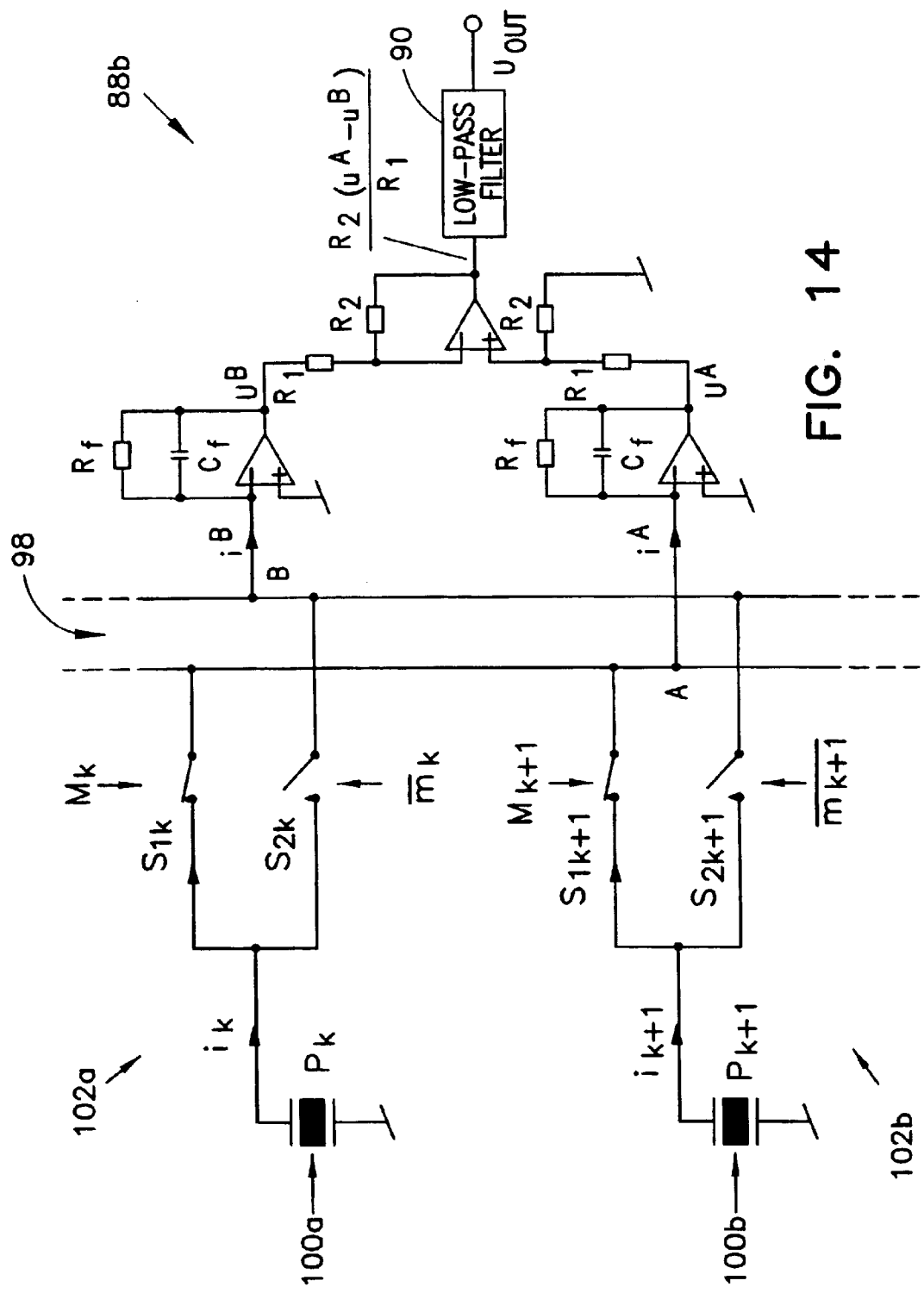
FIG. 14 is a further switch representation for the system of FIG. 9 having a differential pulse-width modulation scheme.

As indicated in the above expression for the range of the coefficients, it is possible via the configuration of FIG. 14 to select a negative value for $I_k$:

$$-R_2/R_1 C_f \leq L_k \leq R_2/R_1 C_f$$

With an appropriate set of modulation signals $m_k$, i.e. a corresponding set of values for the pulse-widths $T_k$'s, the voltage output is made proportional to a modal coordinate of the system. Another modal coordinate can be monitored by selecting another set of values for the parameters $T_k$.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the claims.

What is claimed is:

1. A segmented piezoelectric device comprising:
   a signal generator;
   a polymeric film;
   a plurality of piezoelectric sensors disposed on said polymeric film;
   a plurality of microelectronic circuits disposed on said polymeric film, each microelectronic circuit in communication with a piezoelectric sensor;
   a plurality of conductors disposed on said polymeric film and coupling each microelectronic circuit with said signal generator and an output;
   an amplifier in communication with said output;
   a low pass filter in communication with said amplifier; and
   wherein said signal generator provides an input signal to said microelectronic circuits.

2. The segmented piezoelectric device of claim 1, wherein said signal generator is operative to produce a modulated signal.

3. The segmented piezoelectric device of claim 2, wherein said signal generator is operative to produce a modulate signal for each microelectronic circuit.

4. The segmented piezoelectric device of claim 2, wherein each microelectronic circuit comprises switch circuitry operative to provide an output signal in conjunction with said signal generator.

5. The segmented piezoelectric device of claim 2, wherein said signal generator is a sine voltage generator and is in communication with said plurality of conductors via a ribbon cable.

6. The segmented piezoelectric device of claim 2, wherein said amplifier is a differential charge amplifier.

7. The segmented piezoelectric device of claim 2, wherein said amplifier is coupled to said output via a pair of coaxial cables.

8. A method of modal filtering comprising:

providing a segmented piezoelectric device having a plurality of piezoelectric sensors disposed on said polymeric film, a plurality of microelectronic circuits disposed on said polymeric film, each microelectronic circuit in communication with a piezoelectric sensor, and a plurality of conductors disposed on said polymeric film and coupling each microelectronic circuit with said signal generator and an output;

providing a modulated signal to each microelectronic circuit;

collecting an output from each piezoelectric sensor in an amplifier; and filtering an output of said amplifier.

* * * * *